United States Patent
Paleari et al.

(10) Patent No.: US 9,401,328 B2
(45) Date of Patent: Jul. 26, 2016

(54) ELECTRIC CONTACT STRUCTURE HAVING A DIFFUSION BARRIER FOR AN ELECTRONIC DEVICE AND METHOD FOR MANUFACTURING THE ELECTRIC CONTACT STRUCTURE

(71) Applicant: STMicroelectronics S.r.l., Agrate Brianza (IT)

(72) Inventors: Andrea Paleari, Brugherio (IT); Lorenzo Gola, Cusago (IT); Federica Ronchi, Bellusco (IT); Sonia Pirotta, Monza Brianza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/865,261

(22) Filed: Sep. 25, 2015

(65) Prior Publication Data
US 2016/0181203 A1    Jun. 23, 2016

(30) Foreign Application Priority Data
Dec. 22, 2014  (IT) ............... TO2014A1090

(51) Int. Cl.
*H01L 23/52* (2006.01)
*H01L 23/532* (2006.01)
*H01L 21/768* (2006.01)
*H01L 23/528* (2006.01)
*H01L 21/288* (2006.01)
*H01L 21/285* (2006.01)

(52) U.S. Cl.
CPC ...... *H01L 23/53238* (2013.01); *H01L 21/2855* (2013.01); *H01L 21/2885* (2013.01); *H01L 21/28556* (2013.01); *H01L 21/76804* (2013.01); *H01L 21/76846* (2013.01); *H01L 21/76873* (2013.01); *H01L 21/76877* (2013.01); *H01L 23/5283* (2013.01)

(58) Field of Classification Search
CPC .............. H01L 27/101; H01L 23/5252; H01L 2924/0002; H01L 2924/00
See application file for complete search history.

(56) References Cited

U.S. PATENT DOCUMENTS

| 2005/0020047 | A1 | 1/2005 | Mis et al. |
| 2006/0170103 | A1* | 8/2006 | Suh .................. H01L 21/76843 257/751 |
| 2008/0237862 | A1* | 10/2008 | Tanaka ................. H01L 27/101 257/751 |

FOREIGN PATENT DOCUMENTS

EP    0276087    7/1988

OTHER PUBLICATIONS

IT Search Report and Written Opinion for IT TO2014A001090 dated Sep. 9, 2015 (8 pages).

* cited by examiner

*Primary Examiner* — Roy Potter
(74) *Attorney, Agent, or Firm* — Gardere Wynne Sewell LLP

(57) ABSTRACT

An electric contact structure includes a first structural layer; a second structural layer made of dielectric material extending over the first structural layer; and an intermediate layer made of conductive material extending between the first structural layer and the second structural layer. A trench extends in the second structural layer delimited laterally by a wall of the second structural layer and at the bottom by a surface region of the intermediate layer. A diffusion barrier extends in the trench covering the surface region of the intermediate layer and the wall of the second structural layer. The diffusion barrier is a TiW—TiN—TiW tri-layer.

12 Claims, 3 Drawing Sheets

ELECTRIC CONTACT STRUCTURE HAVING A DIFFUSION BARRIER FOR AN ELECTRONIC DEVICE AND METHOD FOR MANUFACTURING THE ELECTRIC CONTACT STRUCTURE

PRIORITY CLAIM

This application claims priority from Italian Application for Patent No. TO2014A001090 filed Dec. 22, 2014, the disclosure of which is incorporated by reference.

TECHNICAL FIELD

The present invention relates to an electric contact structure having a diffusion barrier for an electronic device, and to a method for manufacturing the electric contact structure.

BACKGROUND

In the state of the art of semiconductor devices, it is known to use metal contacts formed within previously etched trenches, such as through vias in dielectric layers that form part of semiconductor devices. Typically, the metal used to form the metal contacts or the through vias is copper. A known embodiment envisages a step of formation of a diffusion barrier in order to prevent diffusion of the copper in underlying layers, formation (typically by sputtering) of a seed layer, and then completion of the metal contact by electroplating.

A barrier of a known and used type envisages a layer of titanium-tungsten (TiW). Other types of diffusion barrier are known, for example a bilayer of TaN/Ta.

The reliability of the interconnections depends above all upon the quality of the interfaces, in particular upon the interface between the diffusion barrier and the copper seed layer. A seed layer that does not extend in a uniform and continuous way over the barrier layer, and with good adhesion thereto, may cause formation of voids during the electroplating step, or in general structural defects of the intermetal connection thus formed.

The TiW diffusion barrier is formed, according to the known art, by physical vapor deposition (PVD). Different factors, inherent in the PVD process, render this step problematic. In particular, the present applicant has found that TiW layers, deposited in trenches using the PVD technique, tend to be discontinuous on account of formation of islands during the process of growth. In other words, the barrier-diffusion layer presents cracks and in general an inadequate surface uniformity. Formation of the copper seed layer on a barrier layer presenting these defects, and the subsequent copper electroplating, has as consequence generation of voids and defects in the metal connection.

Furthermore, in the case where the barrier layer presents cracks or non-covered regions on account of the low uniformity of deposition obtained using the PVD technique, there exists the risk of a migration of the copper towards other regions of the semiconductor device, with consequent contamination of said regions and possible malfunctioning of the device itself.

A possible solution to this problem is use of a different technique of deposition of the barrier layer, in particular the chemical-vapor-deposition (CVD) technique. However, the CVD technique is not practicable in situations where the region exposed via the trench, or in general the region on which it is desired to form the metal connection, is itself a metal region (e.g., a copper region), which, during CVD, could release metal ions in the deposition chamber and on the surface of the semiconductor device as a result of the deposition conditions (temperature, action of the plasma, etc.).

For this reason, use of the CVD technique, which would guarantee a conformable deposition, is not practicable in this context.

SUMMARY

In an embodiment, an electric contact structure is provided for an electronic device and a method for manufacturing the electric contact structure is provided that will enable reduction of the risk of diffusion of the copper towards other regions of the semiconductor device, with consequent malfunctioning of the device itself.

According to the present invention, an electric contact structure for an electronic device and a method for manufacturing the electric contact structure are provided as defined in the annexed claims.

BRIEF DESCRIPTION OF THE DRAWINGS

For a better understanding of the invention, some embodiments thereof will now be described, purely by way of non-limiting example and with reference to the attached drawings, wherein.

DETAILED DESCRIPTION

Figure 1:
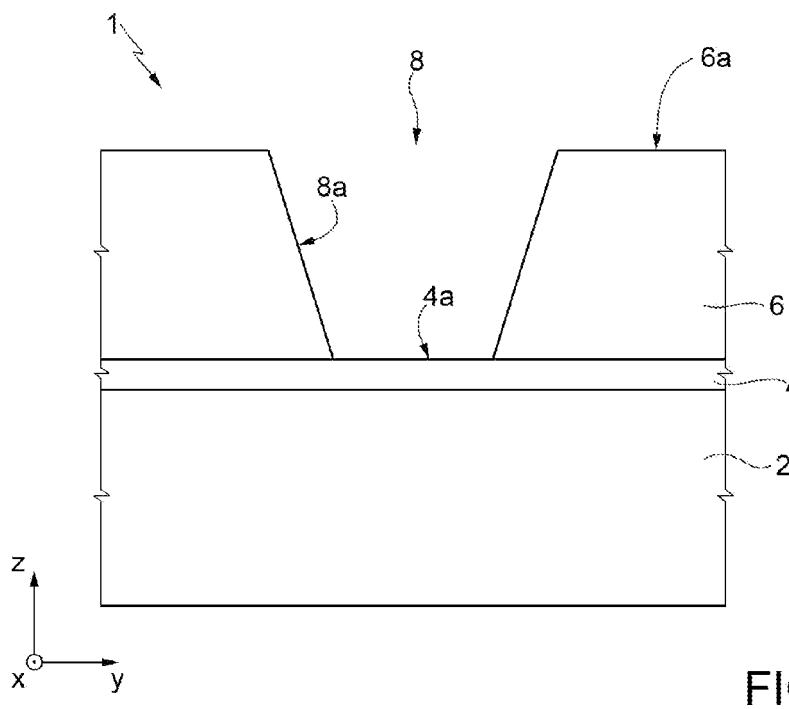
FIG. 1 shows, in lateral sectional view, a portion of an electric contact structure in an intermediate manufacturing step.

FIG. 1 shows a portion of a semiconductor wafer 1 during an intermediate step of manufacture of an electronic device (not illustrated as a whole). In general, the representation of FIG. 1 regards a semiconductor structure or electric contact structure.

The wafer, or semiconductor structure or electric contact structure, 1 includes a substrate 2 made of semiconductor material, for example silicon, arranged in a plane XY and having a thickness in a direction Z. Extending over the substrate 2 is a metal layer 4, for example made of copper, aluminum, or their alloys.

According to a different embodiment, the layer designated by the reference number 2 may be an intermediate structural layer of the wafer 1, different from, and additional to, a substrate of the wafer 1 itself. For simplicity of description, in what follows the layer 2 will be referred to as "substrate", without this implying any loss of generality.

Extending over the metal layer 4 is a structural layer 6, for example made of dielectric material such as silicon oxide or else silicon nitride or a combination of the two. A trench, or hole, 8 extends through the structural layer 6, along the axis Z, reaching and exposing a surface region 4a of the metal layer 4. The surface region 4a of the metal layer 4 forms a bottom of the trench 8. The structural layer 6 has a top surface 6a parallel to the plane XY, from which there departs a side wall 8a of the trench 8, which delimits the trench 8 laterally. The side wall 8a extends, for example, vertically along the axis Z or else along an inclined plane, as illustrated in FIG. 1.

Figure 2:
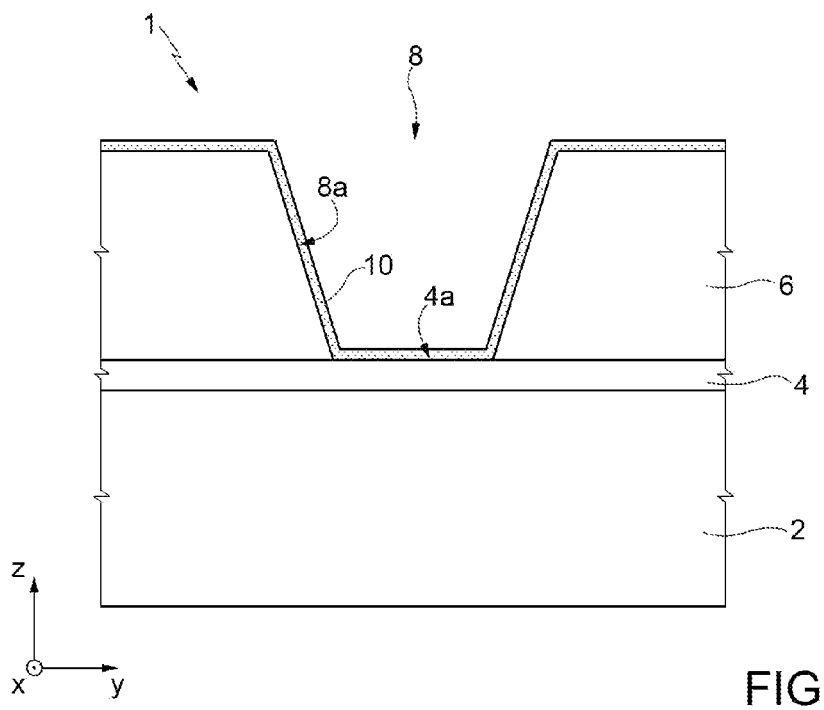
FIGS. 2-4 show the portion of the electric contact structure of FIG. 1 during steps of formation of a diffusion barrier of the electric contact structure.

With reference to FIG. 2, a first barrier layer 10 is formed on the structural layer 6 (in particular, on the surface 6a), and within the trench 8 (in particular, on the side wall 8a and on the surface region 4a). The first barrier layer 10 is formed a process of physical vapor deposition (PVD). According to one embodiment, the first barrier layer 10 is formed by depositing, using the PVD technique, a titanium-tungsten (TiW) alloy. As is known, a TiW layer deposited using the PVD technique may present a poor surface uniformity due to the columnar growth of the material.

The first barrier layer 10 has a thickness chosen in the range 100-200 nm, in particular 150 nm with a deposition time of approximately 40 s at subatmospheric pressure to guarantee complete covering of the surfaces 6a, 8a, 4a with a good uniformity.

Figure 3:
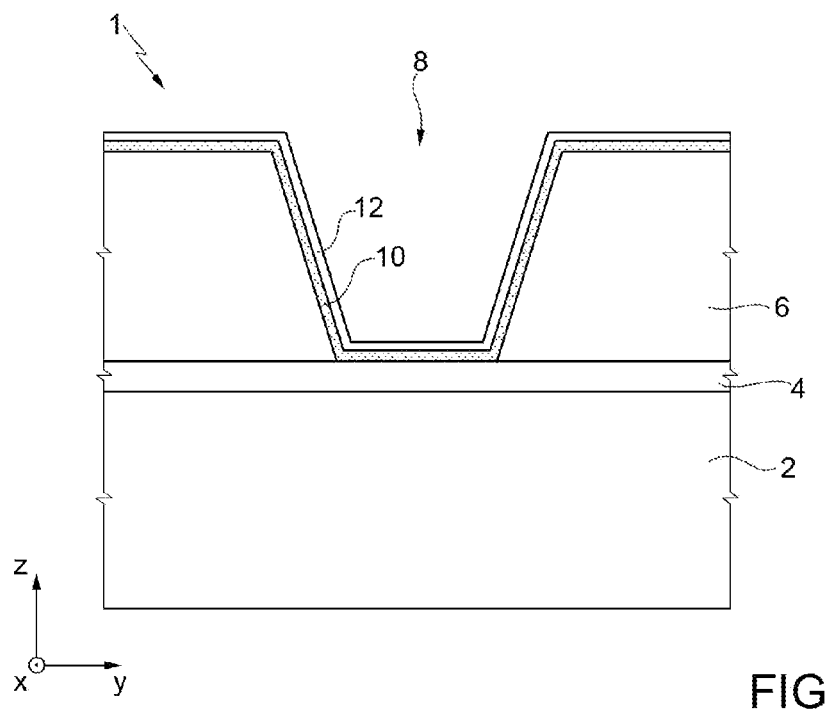

Then (FIG. 3), a second barrier layer 12 is formed. The second barrier layer 12 extends over the wafer 1, as described with reference to the first barrier layer 10. In particular, the second barrier layer 12 extends into the trench 8, on the side wall 8a and on the bottom 4a. In other words, the second barrier layer 12 covers completely, also inside the trench 8, the first barrier layer 10.

The second barrier layer 12 is formed using a chemical-vapor-deposition (CVD) technique. According to one embodiment, the second barrier layer 12 is formed by depositing titanium nitride (TiN) using the CVD technique. The second barrier layer 12 presents, as a result of the deposition technique used, a good uniformity of covering of the first underlying barrier layer and a good surface uniformity. In particular, the inventors have found that through the second barrier layer, or part thereof, no cracks or interruptions are present even though deposition is made on the irregular surface of the barrier 10. The second barrier layer 12 has a thickness chosen in the range 5-15 nm, for example 8 or 9 nm at 400° C. at subatmospheric pressure. The lower limit is dictated by the deposition possibility at a manufacturing level; the upper limit is dictated by the sufficient continuity of the film.

Figure 4:
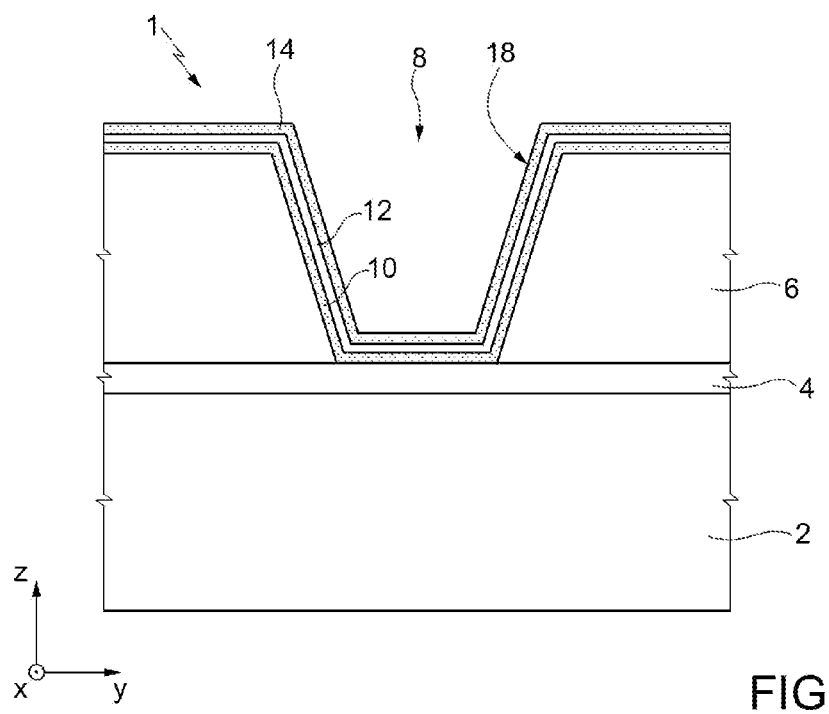

Then (FIG. 4), a third barrier layer 14 is formed. The third barrier layer 14 extends over the wafer 1, as described with reference to the first and second barrier layers 10, 12. In particular, the third barrier layer 14 extends into the trench 8, on the side wall 8a and on the bottom 4a. In other words, the third barrier layer 14 covers the second barrier layer 12 completely, also inside the trench 8.

The third barrier layer 14 is formed using the PVD technique, in a way similar to what has been described with reference to the first barrier layer 10. In particular, the third barrier layer 14 is formed by depositing, using the PVD technique, a titanium-tungsten (TiW) alloy. The third barrier layer 14 has a thickness chosen in the range 50-200 nm, in particular 150 nm, with a deposition time of approximately 40 s at subatmospheric pressure in order to guarantee complete covering, with good uniformity, of the surfaces 6a, 8a, 4a and correct growth of the next seed layer.

Deposition of the third barrier layer 14 using the PVD technique does not generate the problems described previously with reference to the known art. In this case, in fact, the third barrier layer 14 is deposited, using the PVD technique, on the second barrier layer 12, the latter having been deposited using the CVD technique. Since the second barrier layer 12 presents good surface uniformity, good covering of the walls and of the bottom of the trench 8, and is without voids or cracks, also the third barrier layer 14 follows the surface morphology of the second barrier layer 12, presenting itself a good surface uniformity, a good covering of the walls and of the bottom of the trench 8, and absence of voids or cracks.

The first, second, and third barrier layers 10-14 together form a diffusion barrier 18.

Figure 5:
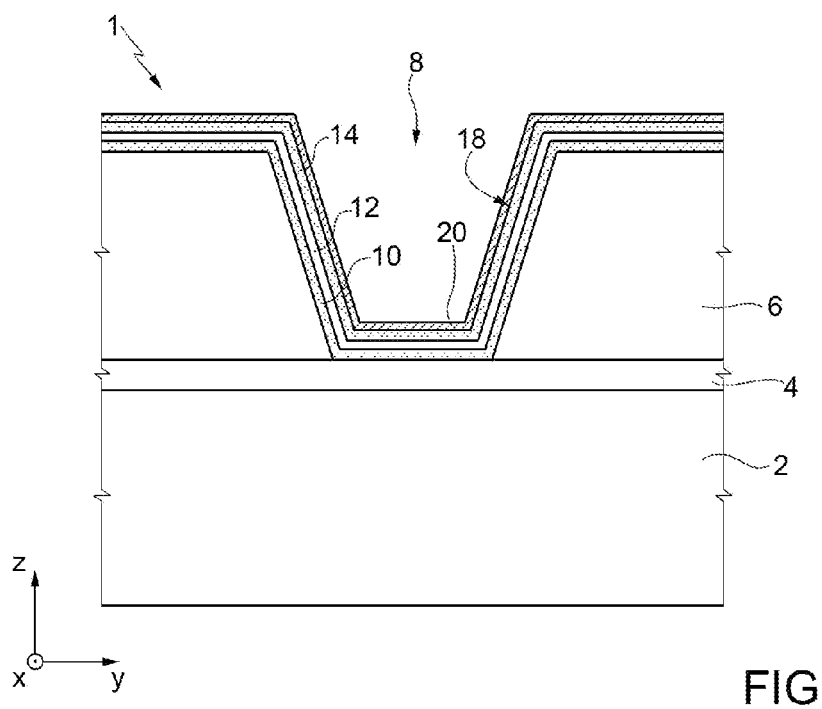
FIGS. 5 and 6 show the portion of the electric contact structure of FIG. 1 in manufacturing steps subsequent to the steps of FIGS. 2-4, for completing the electric contact structure.

With reference to FIG. 5, formed, for example by sputtering, is a copper seed layer 20 that extends over the wafer 1 as has been described with reference to the first, second, and third barrier layers 10, 12 and 14. In particular, the seed layer 20 extends into the trench 8, on the side wall 8a and on the bottom 4a. In other words, the seed layer 20 completely covers the third barrier layer 14 also inside the trench 8.

Figure 6:
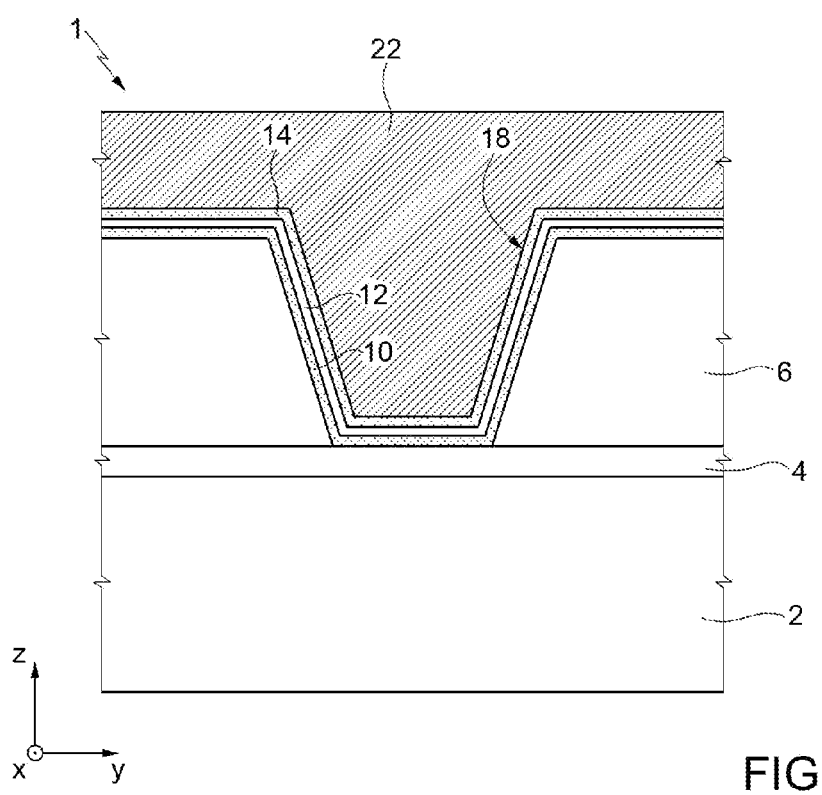

Next (FIG. 6), formed, in particular by copper electroplating, is a metal contact 22 that fills the trench 8 and may be contacted from outside the trench 8 itself.

The diffusion barrier 18 performs an effective function of protection of the structural layer 6 during formation of the seed layer 20 and electroplating of the metal contact 22. Furthermore, the presence of the third barrier layer 14, which presents surface uniformity, enables formation of the metal contact 22 without voids or internal defects. Protection against migration of copper ions from the seed layer 20 and from the metal contact 22 towards the structural layer 6 and 4 is thus guaranteed, together with a good morphology of the metal contact 22 itself.

In a way not illustrated in the figures, it is possible to envisage further steps of fabrication of the wafer 1, for example for removing undesirable portions of the diffusion barrier 18 external to the trench 8, by known steps of dry etching and/or wet etching.

The method of formation of the diffusion barrier 18 and the diffusion barrier 18 itself may be applied to any electronic device provided with a buried metal layer, which may be electrically contacted from outside said electronic device through a metal contact provided in one or more trenches. The buried metal layer is a generic metallization layer, and the diffusion barrier 18, together with the metallization 22, forms, for example, a buried through via, or else an electrical contact accessible from outside the electronic device.

The advantages deriving from the use of a tri-layer of TiW—TiN—TiW to provide the diffusion barrier 18 emerge clearly from the foregoing description. In particular, the interface between the metal layer 4 and the diffusion barrier 18, and between the diffusion barrier 18 and the seed layer 20/metal contact 22, is always of the same material (TiW deposited by PVD) used according to the known art so that the properties of the interfaces remain identical to those provided by the processes according to the known art (possibly optimized as a function of said interfaces).

Furthermore, the use of the central TiN layer, deposited using the CVD technique, guarantees good continuity of the layer 12 thus deposited, which would not be possible to guarantee with one or more consecutive PVD processes. In this way, the third barrier layer 14, deposited using the PVD technique, acquires good characteristics of continuity proper to the second barrier layer 12 and forms a good base for the subsequent growth of the copper.

Finally, the choice of the sequence of deposition, PVD-CVD-PVD, guarantees the absence of any undesirable contamination of the wafer 1 by atoms or ions of copper coming from the metal layer 4 or from the metal contact 22.

Modifications and variations may be made to the device and the method described herein, without thereby departing from the scope of the present invention, as defined in the annexed claims.

The invention claimed is:
1. An electric contact structure for an electronic device, including:
   a first structural layer;

a second structural layer extending over the first structural layer;

an intermediate layer of conductive material extending at least in part between the first structural layer and the second structural layer;

a trench extending through a thickness of the second structural layer in a region of the second structural layer overlying the intermediate layer, the trench being delimited laterally by a wall of said second structural layer and at the bottom by a surface region of the intermediate layer;

a diffusion barrier extending into said trench covering the surface region of the intermediate layer and the wall of the second structural layer, said diffusion barrier being a TiW—TiN—TiW tri-layer.

2. The structure according to claim 1, wherein the diffusion barrier includes:

a first barrier layer of TiW which extends in contact with the surface region of the intermediate layer and with the wall of the second structural layer;

a second barrier layer of TiN which extends over the first barrier layer; and a third barrier layer of TiW which extends over the second barrier layer.

3. The structure according to claim 2, wherein the first barrier layer is formed by the PVD deposition technique, the second barrier layer is formed by the CVD deposition technique, and the third barrier layer is formed by the PVD deposition technique.

4. The structure according to claim 2, wherein the first barrier layer has a thickness of 100-200 nm, the second barrier layer has a thickness of 5-15 nm, and the third barrier layer has a thickness of 100-200 nm.

5. The structure according to claim 1, wherein the intermediate layer is made of metal material selected from the group consisting of: copper, aluminum, and alloys thereof.

6. The structure according to claim 1, further including an electrical contact made of metal material which extends in the trench in electrical contact with the intermediate layer through the trench, the diffusion barrier extending between the surface region of the intermediate layer and the electrical contact and between the wall of the second structural layer and the electrical contact.

7. The structure according to claim 6, wherein the electrical contact is made of copper.

8. A method for manufacturing an electric contact structure for an electronic device, including the steps of:

forming a second structural layer over a first structural layer;

forming an intermediate layer made of conductive material at least in part between the first structural layer and the second structural layer;

forming a trench extending through a thickness of the second structural layer in a region thereof overlying the intermediate layer, said trench delimited laterally by a wall of said second structural layer and at the bottom by a surface region of the intermediate layer;

forming a diffusion barrier in the trench covering the surface region of the intermediate layer and the wall of the second structural layer, wherein forming the diffusion barrier is a TiW—TiN—TiW tri-layer.

9. The method according to claim 8, wherein forming the diffusion barrier includes the steps of:

forming a first barrier layer of TiW in contact with the surface region of the intermediate layer and with the wall of the second structural layer;

forming a second barrier layer of TiN on the first barrier layer; and forming a third barrier layer of TiW on the second barrier layer.

10. The method according to claim 9, wherein forming the first barrier layer includes depositing TiW using a PVD technique, forming the second barrier layer includes depositing TiN using a CVD technique, and forming the third barrier layer includes depositing TiW using the PVD technique.

11. The method according to claim 8, further comprising the step of forming an electrical contact made of metal material in the trench in electrical contact with the intermediate layer through the trench, the barrier layer being formed between the surface region of the intermediate layer and the electrical contact and between the wall of the second structural layer and the electrical contact.

12. The method according to claim 11, wherein forming the electrical contact includes:

depositing on the third barrier layer a seed layer of copper or of a copper alloy; and forming on the seed layer a metal-contact region by electroplating of copper or of a copper alloy.

* * * * *